(12) United States Patent
Imwalle et al.

(10) Patent No.: US 9,398,731 B1
(45) Date of Patent: Jul. 19, 2016

(54) COOLING ELECTRONIC DEVICES IN A DATA CENTER

(71) Applicant: Google Inc., Mountain View, CA (US)

(72) Inventors: Gregory P. Imwalle, Mountain View, CA (US); Eehern J. Wong, Mountain View, CA (US); Emad Samadiani, Mountain View, CA (US); Soheil Farshchian, San Jose, CA (US)

(73) Assignee: Google Inc., Mountain View, CA (US)

( * ) Notice: Subject to any disclaimer, the term of this patent is extended or adjusted under 35 U.S.C. 154(b) by 122 days.

(21) Appl. No.: 14/493,672

(22) Filed: Sep. 23, 2014

(51) Int. Cl.
H05K 7/20 (2006.01)

(52) U.S. Cl.
CPC ........ H05K 7/20781 (2013.01); H05K 7/20736 (2013.01)

(58) Field of Classification Search
CPC ................... H05K 7/20781; H05K 7/20736
USPC ......... 361/679.46–679.54, 688–723; 165/185
See application file for complete search history.

(56) References Cited

U.S. PATENT DOCUMENTS

| | | | |
|---|---|---|---|
| 4,777,561 A | 10/1988 | Murphy et al. | |
| 4,884,168 A | 11/1989 | August et al. | |
| 5,768,104 A | 6/1998 | Salmonson et al. | |
| 5,907,475 A | 5/1999 | Babinski et al. | |
| 6,151,215 A | 11/2000 | Hoffman | |
| 6,775,137 B2 | 8/2004 | Chu et al. | |
| 6,804,117 B2 | 10/2004 | Phillips et al. | |
| 6,910,637 B2 | 6/2005 | Hsieh et al. | |
| 6,924,981 B2 | 8/2005 | Chu et al. | |
| 6,972,365 B2 | 12/2005 | Garner | |
| 7,025,129 B2 | 4/2006 | Chiu | |
| 7,130,191 B2 | 10/2006 | Lin et al. | |
| 7,309,911 B2 | 12/2007 | Bartley et al. | |
| 7,318,322 B2 | 1/2008 | Ota et al. | |
| 7,397,662 B2 | 7/2008 | Oyamada | |
| 7,403,384 B2 | 7/2008 | Pflueger | |
| 7,564,685 B2 | 7/2009 | Clidaras et al. | |
| 7,599,184 B2 | 10/2009 | Upadhya et al. | |
| 7,701,714 B2 | 4/2010 | Shabany | |
| 7,719,837 B2 | 5/2010 | Wu et al. | |
| 8,031,464 B2 | 10/2011 | Adkins et al. | |
| 8,077,463 B2 | 12/2011 | Lee | |

(Continued)

FOREIGN PATENT DOCUMENTS

EP      2170030 A2      3/2010

OTHER PUBLICATIONS

Richard M. Russell, "The CRAY-1 Computer System" Communications of the ACM, vol. 21, No. 1, Jan. 1978, pp. 63-72.

(Continued)

*Primary Examiner* — Anthony Haughton
*Assistant Examiner* — Yahya Ahmad
(74) *Attorney, Agent, or Firm* — Fish & Richardson P.C.

(57) ABSTRACT

A cooling apparatus for rack-mounted computing devices includes a heat sink including a thermal interface to conductively contact a computing device mounted on a printed circuit board; a cold plate including a first portion in thermal communication with the heat sink with a working fluid, and a second portion that includes a cooling coil in thermal communication with the first portion, the cooling coil including an inlet to receive chilled liquid; a fan positioned to circulate airflow over the cold plate; and a controller coupled to the fan to adjust a speed of the fan in response to an output of a sensor coupled to the computing device.

21 Claims, 7 Drawing Sheets

(56) References Cited

U.S. PATENT DOCUMENTS

| | | |
|---|---|---|
| 8,644,020 B2 | 2/2014 | Lau et al. |
| 2002/0053726 A1 | 5/2002 | Mikubo et al. |
| 2003/0128508 A1 | 7/2003 | Faneuf et al. |
| 2003/0128516 A1 | 7/2003 | Faneuf et al. |
| 2004/0225816 A1 | 11/2004 | Leigh et al. |
| 2005/0217829 A1* | 10/2005 | Belits ................. F28D 15/0266 165/104.33 |
| 2006/0005980 A1 | 1/2006 | Garner |
| 2006/0232231 A1* | 10/2006 | Chen ....................... G06F 1/206 318/66 |
| 2007/0042514 A1* | 2/2007 | Wu ......................... G06F 1/183 438/17 |
| 2007/0201204 A1* | 8/2007 | Upadhya ............ H05K 7/20727 361/695 |
| 2007/0263355 A1 | 11/2007 | Yu et al. |
| 2008/0013283 A1 | 1/2008 | Gilbert et al. |
| 2008/0043442 A1 | 2/2008 | Strickland et al. |
| 2008/0055848 A1 | 3/2008 | Hamburgen et al. |
| 2009/0021908 A1 | 1/2009 | Patel et al. |
| 2009/0027856 A1 | 1/2009 | McCoy |
| 2009/0133866 A1* | 5/2009 | Campbell ................. G06F 1/20 165/288 |
| 2009/0284924 A1 | 11/2009 | Konshak et al. |
| 2010/0032142 A1 | 2/2010 | Copeland et al. |
| 2010/0073863 A1* | 3/2010 | Matsushima ...... H05K 7/20809 361/679.46 |
| 2011/0182033 A1 | 7/2011 | Tissot et al. |
| 2014/0146466 A1 | 5/2014 | Lau et al. |
| 2014/0198451 A1* | 7/2014 | Kuo ....................... G01K 1/026 361/695 |

OTHER PUBLICATIONS

James S. Kolodzey, "CRAY-1 Computer Technology" IEEE Transactions on Components, Hybrids, and Manufacturing Technology, vol. CHMT-4, No. 2, Jun. 1981, pp. 181-186.

Austin Modine, "Remembering the CRAY-1 When Computers and Furniture Collide" The Register, Jan. 5, 2008, retrieved on Sep. 8, 2010 from http://www.theregisterco.uk/2008/01/05/tob_cray1/print.html, 7 pages.

Andie Hioki, "The CRAY-1 Supercomputer" San Jose State University, 2002, retrieved on Sep. 8, 2010 from http://www.openloop.com/education/classes/sjsu_engr/engr_compOrg/spring2002/studentProjects/Andie_Hioki/Cray1withAdd.htm, 16 pages.

* cited by examiner

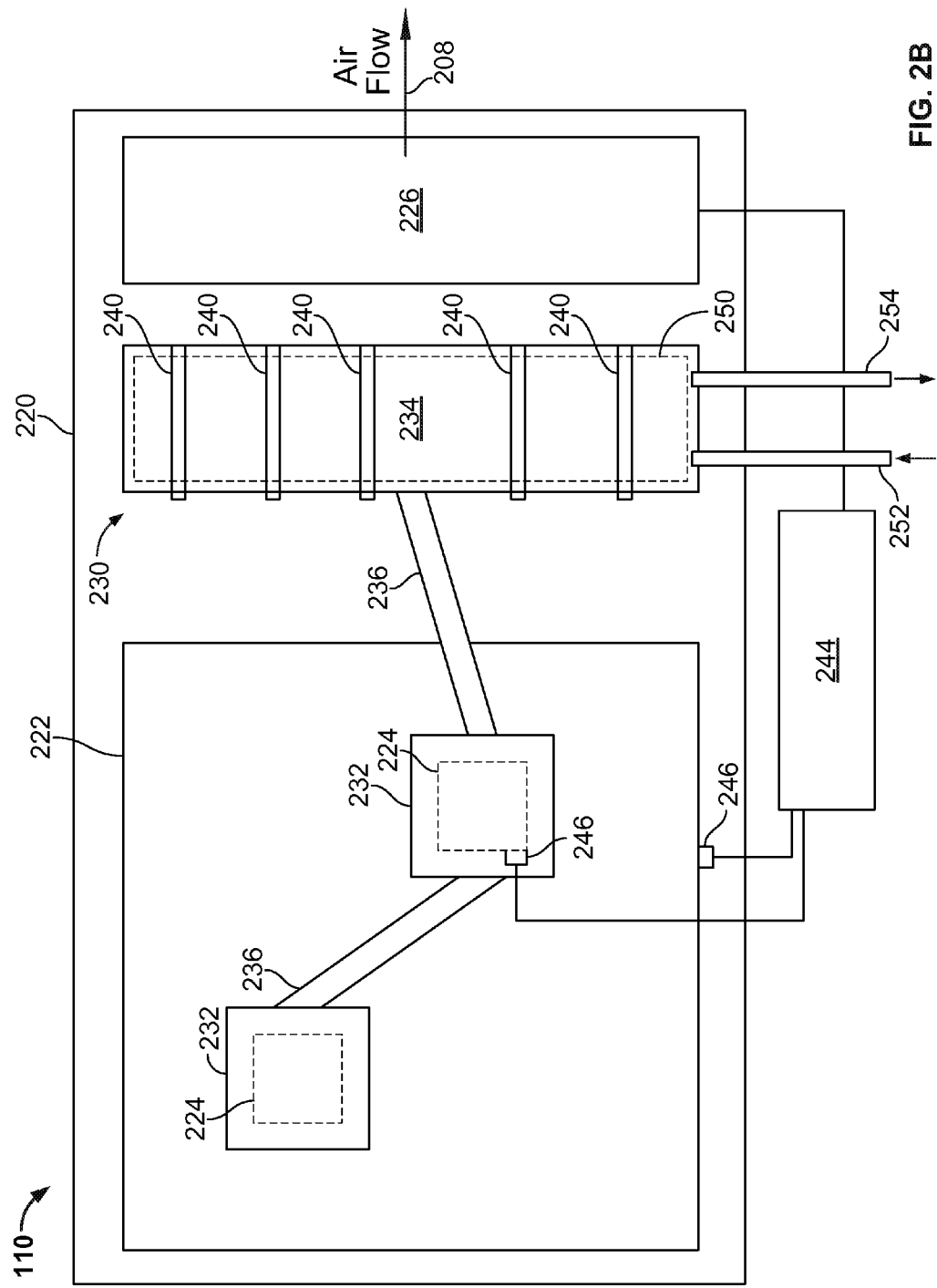

COOLING ELECTRONIC DEVICES IN A DATA CENTER

TECHNICAL FIELD

This document relates to systems and methods for providing cooling to electronic equipment, such as computer server racks and related equipment in computer data centers, with one or more cooling fluids.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

This disclosure describes implementations of a data center cooling system for cooling one or more heat generating electronic devices, such as servers, network devices, and other devices that are typically mounted on server trays or tray sub-assemblies within a data center. In some implementations, the electronic devices may be cooled with a primary cooling source in combination with a secondary cooling source. In some aspects, the primary cooling source may be a cooling liquid that is circulated to, for instance, the server tray sub-assembly, to provide a primary, or base, cooling capacity to remove heat generated by the electronic devices. In some aspects, the secondary cooling source may be a cooling airflow circulated over, for instance, the server tray sub-assembly to provide a secondary, or trim, cooling capacity to remove heat generated by the electronic devices. In alternative aspects, the cooling liquid may be the secondary cooling source and the cooling airflow may be the primary cooling source. In some aspects, the primary source cooling capacity may be less than a maximum heat load of the electronic devices, in which case the secondary cooling source cooling capacity may be designed to account for any excess heat load beyond the primary cooling source cooling capacity.

In an example general implementation, a data center cooling system includes a server tray sub-assembly; a plurality of heat generating electronic devices mounted on the server tray sub-assembly; and a cooling module coupled to the server tray sub-assembly. The cooling module includes a hot side in conductive thermal contact with the plurality of heat generating electronic devices; a cold side including a heat exchanger having a cooling liquid inlet to receive a flow of a cooling liquid and a cooling liquid outlet, the heat exchanger having a cooling capacity of a first portion of a heat load of the plurality of heat generating electronic devices; and a heat transfer surface thermally coupled to the cold side and arranged to receive a cooling airflow, the heat transfer surface having a cooling capacity of a second portion of the heat load of the plurality of heat generating electronic devices.

In a first aspect combinable with the general implementation, the first portion of the heat load is less than a maximum heat load of the plurality of heat generating electronic devices.

In a second aspect combinable with any of the previous aspects, a sum of the heat exchanger cooling capacity and the heat transfer surface cooling capacity is equal to the maximum heat load of the plurality of heat generating electronic devices.

In a third aspect combinable with any of the previous aspects, the cold side includes a first cold plate in conductive thermal contact with the heat transfer surface; and a second cold plate that includes the heat exchanger and is in conductive thermal contact with the first cold plate.

In a fourth aspect combinable with any of the previous aspects, the heat transfer surface includes a base and a plurality of fins extending from the base.

A fifth aspect combinable with any of the previous aspects further includes a fan positioned to circulate the cooling airflow across the heat transfer surface.

A sixth aspect combinable with any of the previous aspects further includes a sensor and a controller.

In a seventh aspect combinable with any of the previous aspects, the sensor is arranged to measure a parameter associated with the heat load of the plurality of heat generating electronic devices.

In an eighth aspect combinable with any of the previous aspects, the controller is communicably coupled to the fan to adjust the fan based, at least in part, on the measured parameter.

In a ninth aspect combinable with any of the previous aspects, the measured parameter includes a temperature of at least one of the plurality of heat generating electronic devices.

In another example general implementation, a method for cooling heat generating devices in a data center includes receiving a heat load, generated by a plurality of heat generating electronic devices supported on a rack-mounted tray, at a hot side of a cooling module coupled to the rack-mounted tray, the hot side in conductive thermal contact with at least a portion of the plurality of heat generating electronic devices; circulating a flow of a cooling liquid to a heat exchanger arranged in a cold side of the cooling module, the flow of the cooling liquid receiving, in the heat exchanger, at least a first portion of the heat load; monitoring a parameter associated with the heat load; based on the monitored parameter, circulating a cooling airflow over a surface of the cold side of the cooling module; and receiving, in the cooling airflow, a second portion of the heat load.

A first aspect combinable with the general implementation further includes transferring the heat load from the hot side to the cold side in a working fluid that circulates between the hot side and the cold side.

In a second aspect combinable with any of the previous aspects, the flow of the cooling liquid is constant.

In a third aspect combinable with any of the previous aspects, a cooling capacity of the constant flow of the cooling liquid is less than a maximum heat load of the plurality of heat generating electronic devices.

A fourth aspect combinable with any of the previous aspects further includes based on a change in the measured parameter, adjusting a rate of the cooling airflow circulated over the surface of the cold side of the cooling module.

A fifth aspect combinable with any of the previous aspects further includes maintaining the flow of the cooling liquid at a constant rate while adjusting the rate of the cooling airflow.

A sixth aspect combinable with any of the previous aspects further includes circulating the cooling airflow over a plurality of fins that extend from the surface of the cold side of the cooling module.

A seventh aspect combinable with any of the previous aspects further includes determining a sub-cooling amount of a working fluid in the cold side of the cooling module; and based on the determined amount of the sub-cooling of the working fluid, adjusting at least one of (i) the flow of the cooling liquid to the heat exchanger arranged in the cold side of the cooling module, or (ii) the cooling airflow circulated over the surface of the cold side of the cooling module.

In an eighth aspect combinable with any of the previous aspects, the determined sub-cooling amount of the working fluid is based, at least in part, on at least one of a temperature difference of the cooling airflow across the cold side of the cooling module; or a temperature difference of the cooling liquid across the heat exchanger.

In another example general implementation, a cooling apparatus for rack-mounted computing devices includes a heat sink including a thermal interface to conductively contact a computing device mounted on a printed circuit board; a cold plate including a first portion in thermal communication with the heat sink with a working fluid, and a second portion that includes a cooling coil in thermal communication with the first portion, the cooling coil including an inlet to receive chilled liquid; a fan positioned to circulate airflow over the cold plate; and a controller coupled to the fan to adjust a speed of the fan in response to an output of a sensor coupled to the computing device.

In a first aspect combinable with the general implementation, the thermal interface includes a phase change material.

In a second aspect combinable with any of the previous aspects, the sensor includes a temperature sensor directly coupled to the computing device, and the controller is configured to adjust the speed of the fan while a flow of the chilled liquid to the cooling coil remains substantially constant.

In a third aspect combinable with any of the previous aspects, the cooling coil has a cooling capacity less than a maximum heat load of the computing device.

In a fourth aspect combinable with any of the previous aspects, the heat sink and the first portion of the cold plate include a heat pipe or a thermosiphon.

Various implementations of a data center cooling system according to the present disclosure may include one, some, or all of the following features. For example, the data center cooling system may provide for redundant cooling of heat generating devices while simplifying a control installation and scheme. The data center cooling system may also minimize or reduce an amount of cooling liquid necessary to cool the heat generating devices. As another example, the data center cooling system may use a particular cooling fluid as a primary cooling source while also using another cooling fluid as a secondary cooling source. The two cooling fluids may be of a similar or identical fluid phase or different fluid phases. One of the two cooling fluids may be a redundant cooling source to the other of the cooling fluids. As a further example, the data center cooling system may utilize a substantially unmodulated flow of a cooling liquid, thereby removing complexities related to a control system (e.g., power, wiring, control software, etc.).

The details of one or more embodiments are set forth in the accompanying drawings and the description below. Other features, objects, and advantages will be apparent from the description and drawings, and from the claims.

DESCRIPTION OF DRAWINGS

FIGS. 2A-2B illustrate schematic side and top views, respectively, of a server rack sub-assembly that includes an example implementation of a fluid cooling system;

DETAILED DESCRIPTION

This disclosure describes implementations of a data center cooling system for cooling one or more heat generating electronic devices, such as servers, network devices, and other devices that are typically mounted on server trays or tray sub-assemblies within a data center. In some implementations, the electronic devices may be cooled with a primary cooling source in combination with a secondary cooling source. In some aspects, the primary cooling source may be a cooling liquid that is circulated to, for instance, the server tray sub-assembly, to provide a primary, or base, cooling capacity to remove heat generated by the electronic devices. In some aspects, the secondary cooling source may be a cooling airflow circulated over, for instance, the server tray sub-assembly to provide a secondary, or trim, cooling capacity to remove heat generated by the electronic devices. In alternative aspects, the cooling liquid may be the secondary cooling source and the cooling airflow may be the primary cooling source. In some aspects, the primary source cooling capacity may be less than a maximum heat load of the electronic devices, in which case the secondary cooling source cooling capacity may be designed to account for any excess heat load beyond the primary cooling source cooling capacity.

Figure 1:
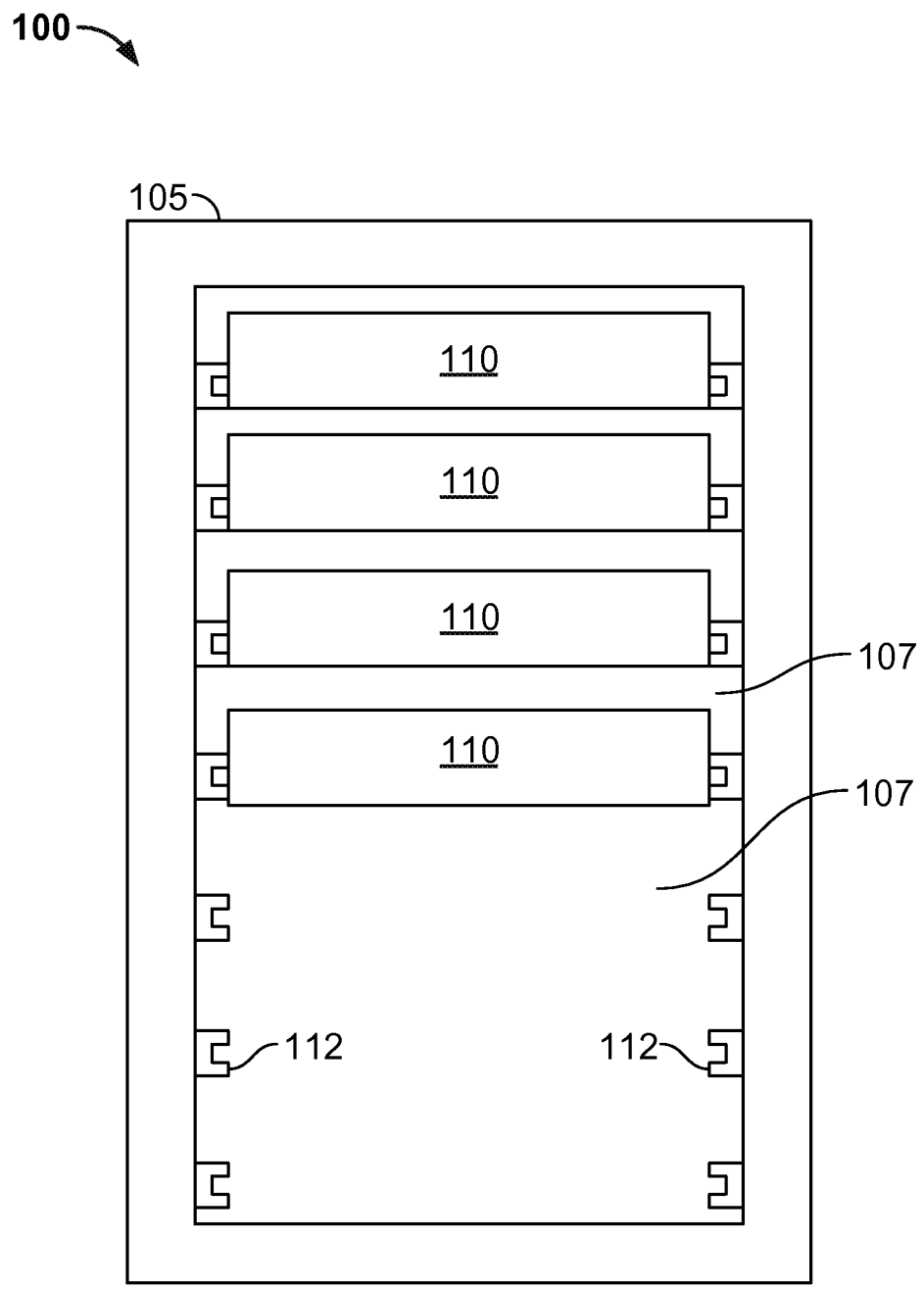
FIG. 1 illustrates a side view of a server rack and a server-rack sub-assembly configured to mount within a rack used in a data center environment.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 2A:
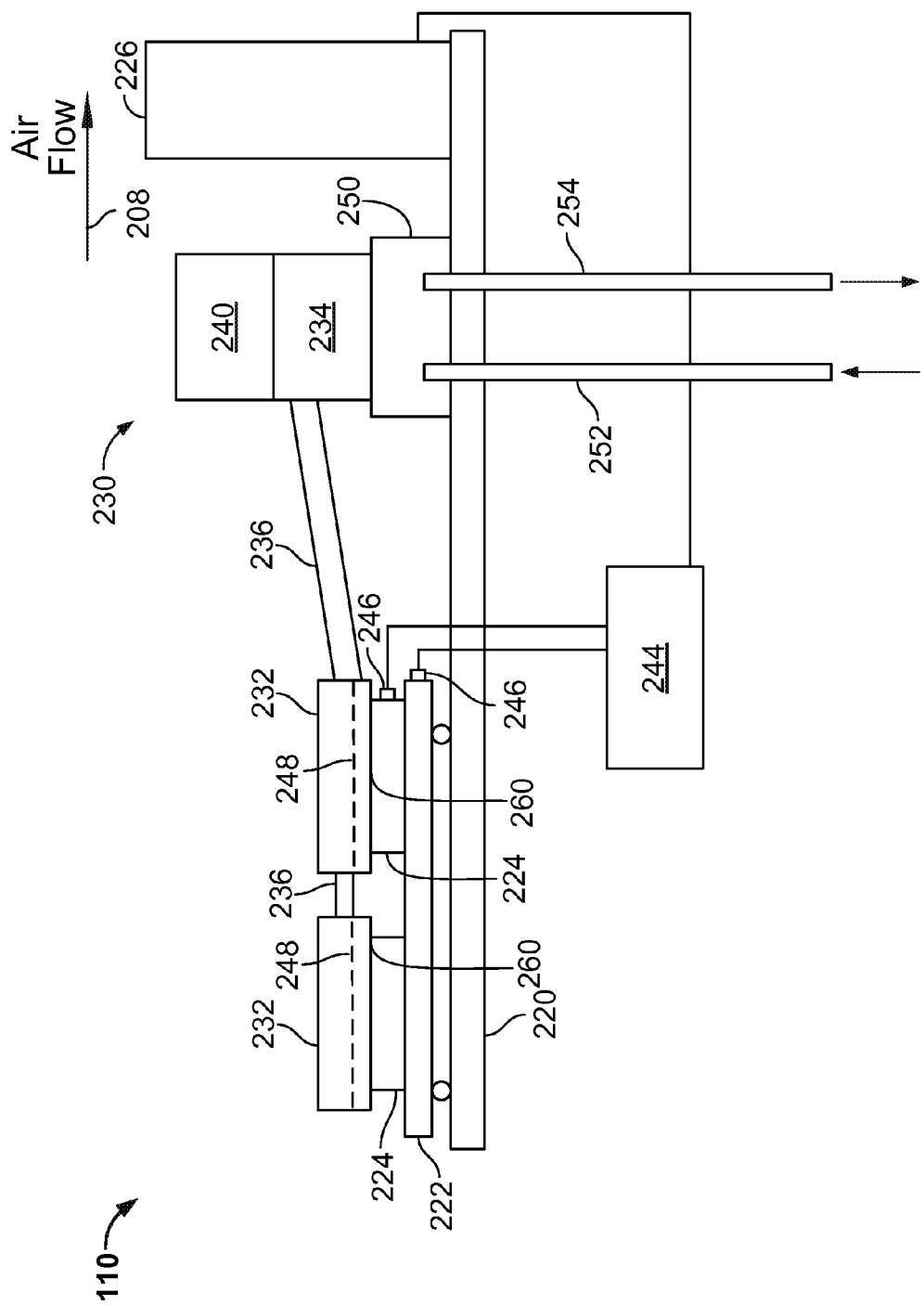

Referring to FIGS. 2A-2B, the server rack sub-assembly 110 includes a frame or cage 220, a printed circuit board 222, e.g., motherboard, supported on the frame 220, one or more heat-generating electronic devices 224, e.g., a processor or memory, mounted on the printed circuit board 222, and a cooling module 230. One or more fans 226 can also be mounted on the frame 220.

The frame 220 can include or simply be a flat structure onto which the motherboard 222 can be placed and mounted, so that the frame 220 can be grasped by technicians for moving the motherboard into place and holding it in position within the rack 105. For example, the server rack sub-assembly 110 may be mounted horizontally in the server rack 105 such as by sliding the frame 220 into the slot 107 and over a pair of rails in the rack 105 on opposed sides of the server rack sub-assembly 110—much like sliding a lunch tray into a cafeteria rack. Although FIGS. 2A-2B illustrate the frame 220 extending below the motherboard 222, the frame can have other forms (e.g., by implementing it as a peripheral frame around the motherboard) or may be eliminated so that the motherboard itself is located in, e.g., slidably engages, the rack 105. In addition, although FIG. 2A illustrates the frame 220 as a flat plate, the frame 220 can include one or more side walls that project upwardly from the edges of the flat plate, and the flat plate could be the floor of a closed-top or open-top box or cage.

The illustrated server rack sub-assembly 110 includes a printed circuit board 222, e.g., a motherboard, on which a variety of components are mounted, including heat-generating electronic devices 224. Although one motherboard 222 is illustrated as mounted on the frame 220, multiple motherboards may be mounted on the frame 220, depending on the needs of the particular application. In some implementations, the one or more fans 226 can be placed on the frame 220 so that air enters at the front edge (at the left hand side in FIGS. 2A-2B) of the server rack sub-assembly 110, closer to the front of the rack 105 when the sub-assembly 110 is installed in the rack 105, flows (as illustrated) over the motherboard 222, over some of the heat generating components on the motherboard 222, and is exhausted from the server rack assembly 110 at the back edge (at the right hand side), closer to the back of the rack 105 when the sub-assembly 110 is installed in the rack 105. The one or more fans 226 can be secured to the frame 220 by brackets. Thus, the fans 226 can pull air from within the frame 220 area and push the air after it has been warmed out the rack 105. An underside of the motherboard 222 can be separated from the frame 220 by a gap.

The server rack sub-assembly 110 includes a cooling module 230 that operates to move heat from the electronic devices 224, to a hot side 232 of the cooling module, and to a cold side 234 of the cooling module 230 to be transferred away from the sub-assembly 110 with one or more cooling fluids. In the example implementation shown in FIGS. 2A-2B, the cooling module 230 is a thermosiphon that includes one or more evaporators 232 as the hot side, condensate/vapor lines 236, and a condenser 234 as the cold side. A working fluid 248 is circulated between the evaporator 232 and the condenser 234. In alternative aspects, however, the cooling module 230 may be a heat pipe, a heat pump, or other device that is operable to transfer heat from a hot side 232 located on, in thermal conductive conduct with, or near the electronic devices 224 to a cold side 234 to be removed by the one or more cooling fluids. In some aspects, a thermal interface 260, such as a phase change heat transfer material, may be positioned between the electronic devices and the evaporator 232, e.g., to increase conductive heat transfer therebetween.

As a thermosiphon, the cooling module 230 operates as follows. The evaporator 232 contacts the electronic device 224 so that heat is drawn by conductive heat transfer from the electronic device 224 to the evaporator 232. For example, the evaporator 232 is in conductive thermal contact with the electronic device 224. In particular, the bottom of the evaporator 232 contacts the top of the electronic device 224. In operation, heat from the electronic device 224 causes a working fluid 248 in the evaporator 232 to evaporate. The vapor then passes through condensate/vapor lines 236 to the condenser 234.

As shown in FIG. 2A, the condensate/vapor line 236 is at a slight (non-zero) angle so that gravity causes the condensed working fluid 248 to flow back through the condensate/vapor line 236 to the evaporator 232. Thus, in some implementations, at least a portion of the condensate/vapor lines 236 is not parallel to the main surface of the frame 220. For example, the condenser-side end of the condensate/vapor line 236 can be about 1-5 mm, e.g., 2 mm, above the evaporator-side end of the condensate/vapor line 236. However, it is also possible for the condensate/vapor line 236 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIG. 2A, there is a first evaporator 232 and a second evaporator 232 as well as a first electronic device 224 and a second electronic device 224. The condensate/vapor line 236 connecting the first evaporator to the second evaporator can be level.

During operation, the top surface of the working fluid 248 (as a liquid) inside the condenser 234 will be above the top surface liquid height of the working fluid 248 in the evaporator 232, e.g., by 1 to 10 mm. It can be easier to achieve this with a condensate/vapor line 236 that is at a slight (positive non-zero) angle, but proper selection of the thermal and mechanical properties of the working fluid 248 in view of the expected heat transport requirements for the thermosiphon system 230 may still achieve this for a condensate/vapor line 236 that is horizontal or at a slightly negative angle. During operation, the liquid phase of a working fluid 248 can fill a bottom portion of an interior volume of the condensate/vapor line 236, with the bottom portion extending from the condenser 234 to the evaporator 232, and a vapor phase of the working fluid 248 can pass through a top portion of the interior volume of the condensate/vapor line 236, with the top portion extending from the condenser 234 to the evaporator 232.

In some implementations, the condenser 234 can be located at a height above the evaporator 232 such that a liquid phase of the working fluid 248 fills a bottom portion of an interior volume of the condensate/vapor line 236 and such that during operation a top surface of the liquid phase has at a non-zero angle relative to horizontal from the condenser 232 to the evaporator 234, and a vapor phase of the working fluid 248 can pass through a top portion of the interior volume of the condensate/vapor line 236, the top portion extending from the condenser 234 to the evaporator 232.

FIGS. 2A-2B illustrate a cooling module 230 (e.g., a thermosiphon) with multiple evaporators 232; each evaporator 232 can contact a different electronic device 224, or multiple evaporators 232 could contact the same electronic device, e.g., if the electronic device is particularly large or has multiple heat generating regions. The multiple evaporators 232 can be connected by the condensate/vapor lines 236 to the condenser 234 in series, e.g., a first condensate/vapor line connects the condenser 234 to a first evaporator 232, and a second condensate/vapor line 236 connects the first evaporator 232 to a second evaporator 232. Alternatively, some or all of the multiple evaporators 232 can be connected by the condensate/vapor lines 236 to the condenser 234 in parallel, e.g., a first condensate/vapor line connects the condenser to a first evaporator, and a second condensate/vapor line connects the condenser 234 to a second evaporator. Advantages of a serial implementation may be fewer tubes, whereas an advantage of parallel tubes is that the tube diameters can be smaller.

FIGS. 2A-2B illustrate a cooling module 230 (e.g., thermosiphon) in which a common line is used for both the condensate flow from the condenser 234 to the evaporator 232 and for vapor flow from the evaporator 232 to the condenser 234. Thus, in this implementation, the fluid coupling between the evaporator 232 and the condenser 234 consists of the combined condensate and vapor transfer line 236. In some implementations, there can be separate lines for the vapor and the condensate. However, a potential advantage of the combined condensate and vapor transfer line is that the line can be connected to a side of the condenser, reducing the vertical height of the system relative to a system with a separate line for the vapor, since the vapor line is typically coupled to or near the top of the evaporator. The condensate/vapor line 236 can be a flexible tube or pipe, e.g., of copper or aluminum.

As illustrated, a cold side 250 is mounted on the server tray sub-assembly 110 in conductive thermal contact with the cold side 234. In some aspects, there may be a single cold side portion of the cooling module 230 that includes both the cold side 234 and the cold side 250. The cold side 250, as illustrated, receives a cooling liquid supply 252 and outputs a cooling liquid return 254. The cold side 250, therefore, is or includes a heat exchanger (e.g., shell and tube, plate and frame, fin and tube, or otherwise) that receives a cooling liquid (e.g., chilled water, condenser water, chilled glycol, ammonia, refrigerant, or otherwise) and transfers heat from the cold side 234 (e.g., received from the electronic devices 224 through the working fluid 248) to the cooling liquid.

In some aspects, the cooling liquid supply 252 is coupled to a cooling plant (not shown) that generates, e.g., through chilled water mechanical refrigeration, evaporative cooling, DX refrigeration, or otherwise, the cooling liquid and circulates (e.g., pumps) the cooling liquid in the cooling liquid supply 252. In particular, in some aspects, the cooling liquid supply 252 and cooling liquid return 254 are the same phase (e.g., liquid) in that no phase change occurs in the cold side 250.

Further, in some aspects, a flow rate of the cooling liquid supply 252 (and return 254) is substantially constant (e.g., unmodulated). For instance, the cooling liquid supply 252 may be circulated (e.g., pumped) to the cold side 250 at a constant, non-zero flow rate that can be determined or calculated according to an expected heat load (e.g., an average or median heat load) of the electronic devices 224. In another example, the constant, non-zero flow rate that can be determined or calculated according to a maximum heat load of the electronic devices 224. As another example, the constant, non-zero flow rate that can be determined or calculated according to historical data of a heat load of the electronic devices 224 (e.g., by time of day, time of month, time of year, workload of the electronic devices 224, expected or actual utilization of the electronic devices 224, or otherwise).

In other example implementations, the cooling liquid supply 252 may be circulated (e.g., pumped) to the cold side 250 at a variable, non-zero flow rate that can be determined or calculated according to an expected heat load (e.g., an average or median heat load) of the electronic devices 224, a maximum heat load (e.g., based on a nameplate power capacity) of the electronic devices 224, or otherwise. In such examples, there may be one or more control valves (not shown) coupled to the cooling liquid supply 252 or a cooling liquid return 254 in order to modulate the flow rate (e.g., by the controller 244).

The cooling liquid supply 252 may have a cooling capacity sized or designed (e.g., flow rate and/or temperature) to remove all or part of a heat load of the electronic devices 224. For instance, in some aspects, the cooling liquid supply 252 may be a primary cooling source for the server tray sub-assembly 110. In some examples, all of the heat generated by the electronic devices 224 may be transferred to the cold side 234 through the cooling module 230, and then, by conductive heat transfer, to the cold side 250. The heat transferred to the cold side 250 may then be transferred to the cooling liquid supply 252. In some examples, the cooling capacity (e.g., flow rate and/or temperature) of the cooling liquid supply 252 may be sized to remove less than a maximum possible heat load of the electronic devices 224 (e.g., based on nameplate power ratings), but enough to remove a heat load of the electronic devices 224 during normal operating conditions (e.g., less than a maximum possible heat load of the electronic devices 224).

In some instances, normal operating conditions of the electronic devices 224 may produce an average heat load that is less than the maximum heat load. For example, a fixed amount of cooling liquid supply 252 may be circulated to the cold side 250, and that fixed amount may be less than an amount needed to remove all of the heat load of the electronic devices 224 operating at a maximum, or nameplate, power. Thus, in some cases, the ability to allocate less than the absolute maximum amount of cooling liquid supply 252 to a server tray sub-assembly 110 (and many thousands of such sub-assemblies 110 in a data center) may provide that more sub-assemblies 110 (and devices 224) can be cooled with the same amount cooling liquid from a facility cooling plant. Or, the facility cooling plant can be downsized while still cooling the same amount of sub-assemblies 110 (and devices 224).

As shown in FIGS. 2A-2B, another cooling fluid, in the form of an airflow 208, may be circulated over the cold side 234 by the fans 226 to convectively remove heat from the electronic devices 224. In some examples, the airflow 208 may be a secondary cooling source in combination with the cooling liquid supply 252 as the primary cooling source. Further, the cold side 234 may include a heat transfer surface 240 (e.g., fins or otherwise) to enhance a rate of heat transfer from the cold side 234 to the airflow 208. Heat, from the electronic devices 224, that is transferred to the airflow 208, may be removed from the server tray sub-assembly 110, e.g., by circulating the airflow 208 to an ambient environment, to a heat exchanger (e.g., cooling coil) that transfers the heat to a cooling liquid, or otherwise.

As shown in FIGS. 2A-2B, a controller 244 (or control system) is communicably coupled to one or more sensors 246 and the fan 226. Generally, the controller 244 may receive one or more inputs from the sensors 246 (as well as other inputs) and control the fan 226 (e.g., a speed or operational state). In some aspects, inputs into the controller 244, such as the sensors 246 may be indicative of the heat load of the electronic devices 224. For example, the sensors 246 may measure a temperature of the electronic devices 224 and/or the motherboard 222. Also, sensors may measure a temperature, pressure, and/or liquid level of the working fluid 248 in the evaporator 232. Although not specifically shown, temperature, pressure, and/or level of the working fluid 248 may be measured in the condenser 234 or conduit 236 as indicative of the heat load of the electronic devices 224.

One or more operational parameters of the electronic devices 224 may also be measured by sensors (not shown) that may be indicative of the heat load of the electronic devices 224. For example, power usage (e.g., current, voltage, or power) of the electronic devices 224 may be measured and may be indicative of the heat load of the electronic devices 224. As another example, operational speed or frequency (e.g., Hz) of the electronic devices 224 may be measured and may be indicative of the heat load of the electronic devices 224. As another example, utilization (e.g., number of jobs executed or to be executed, or otherwise) of the electronic devices 224 may be measured and may be indicative of the heat load of the electronic devices 224. Such parameters may also be provided to the controller 244.

Sensed, calculated, measured, or otherwise determined parameters associated with the heat load of the electronic devices 224 may be provided to (or determined by) the controller 244 and used to control, for example, the fan 226. For example, a dynamic, or real-time, heat load of the electronic devices 224 may be determined or calculated according to such parameters. The controller 244 may determine that, in some cases, the dynamic, or real-time, heat load of the electronic devices 224 may be removed and transferred to a primary cooling source, e.g., the cooling liquid supply 252, without a secondary cooling source, e.g., the cooling airflow 208 circulated by the fan 226. In such cases, the controller 244 may control the fan 226 to an "off," or minimal airflow, position.

The controller 244 may determine that, in some cases, the dynamic, or real-time, heat load of the electronic devices 224 may be above or exceed a cooling capacity of a primary cooling source, e.g., the cooling liquid supply 252. In such cases, the controller 244 may control a secondary cooling source, e.g., the airflow 208 circulated over the cold side 234, to account for a difference between the dynamic heat load of the electronic devices 224 and the cooling capacity of the cooling liquid supply 252. For example, the fan 226 may be controlled to an "on" position, or may be increased in speed, based on the excess heat load over the cooling capacity of the cooling liquid supply 252. In some instances, the speed of the fan 226 may be controlled by the controller 244 proportionally (e.g., directly or indirectly) based on the excess heat load over the cooling capacity of the cooling liquid supply 252. Thus, the cooling airflow 208 circulated by the fan 226 over the cold side 234 may be used to provide an additional cooling capacity with the cooling capacity of the cooling liquid supply 252 to cool the electronic devices 224.

In some aspects, the secondary cooling source, e.g., the cooling airflow 208 circulated by the fan 226, may be a redundant cooling source to the primary cooling source, e.g., the cooling liquid supply 252. For example, both of the cooling liquid supply 252 and the cooling airflow 208 circulated by the fan 226 may be sized to provide a cooling capacity about equal to an expected heat load of the electronic devices 224, whether the expected heat load is a heat load due to average use (e.g., power) of the electronic devices 224, a heat load due to maximum use (e.g., power) of the electronic devices 224, or otherwise. Thus, the controller 244 may determine and/or select the particular cooling source to use. For example, the controller 244 may modulate a valve (not shown) fluidly coupled to the cooling liquid supply 252 to a closed position and control the fan 226 to provide a cooling capacity for the heat load of the electronic devices 224. As another example, the controller 244 may turn off or slow down the fan 226 and open or modulate the valve fluidly coupled to the cooling liquid supply 252 to provide a cooling capacity for the heat load of the electronic devices 224.

Figure 3A:
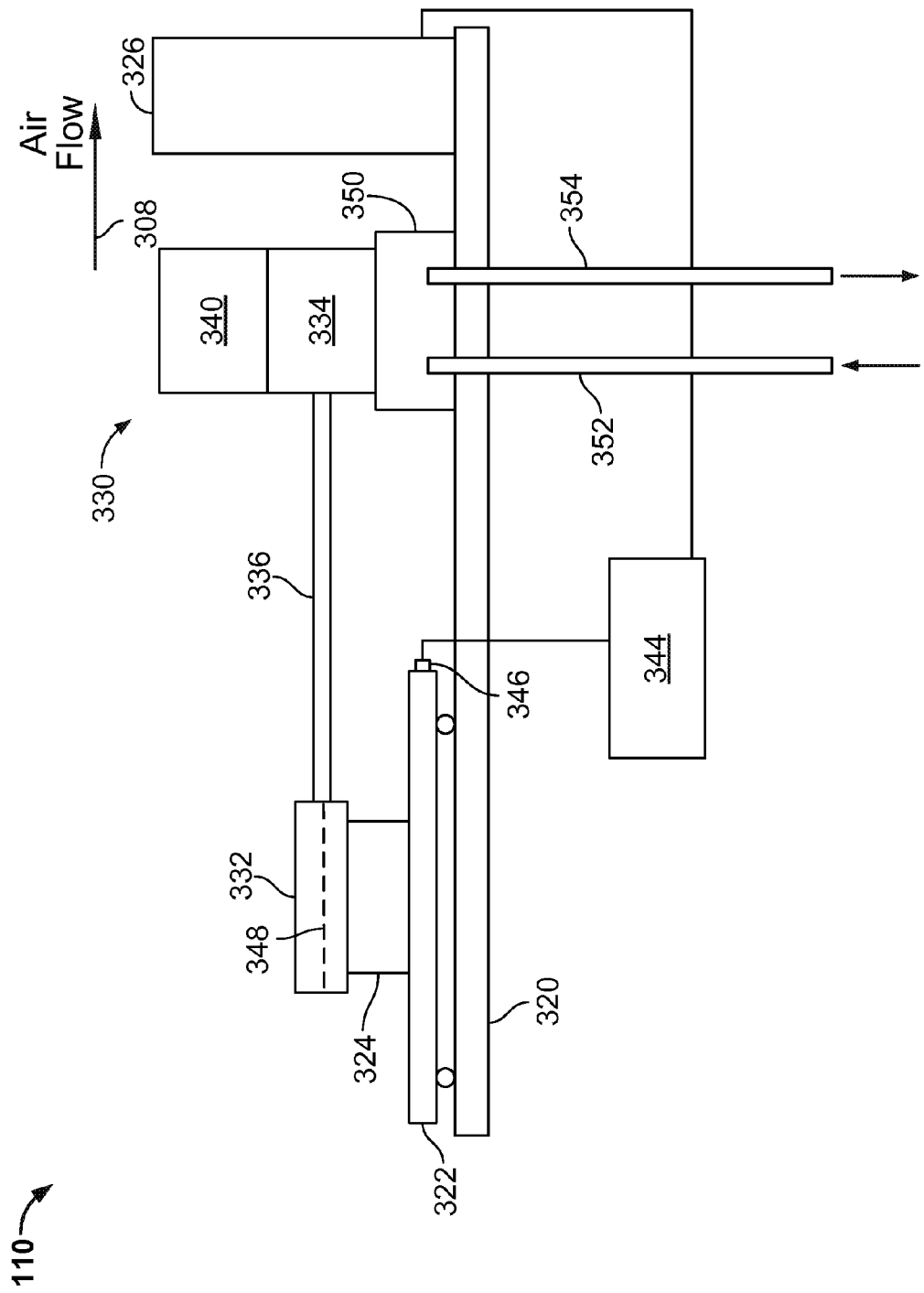
FIGS. 3A-3B illustrate schematic side and top views, respectively, of a server rack sub-assembly that includes another example implementation of a fluid cooling system.
Figure 3B:
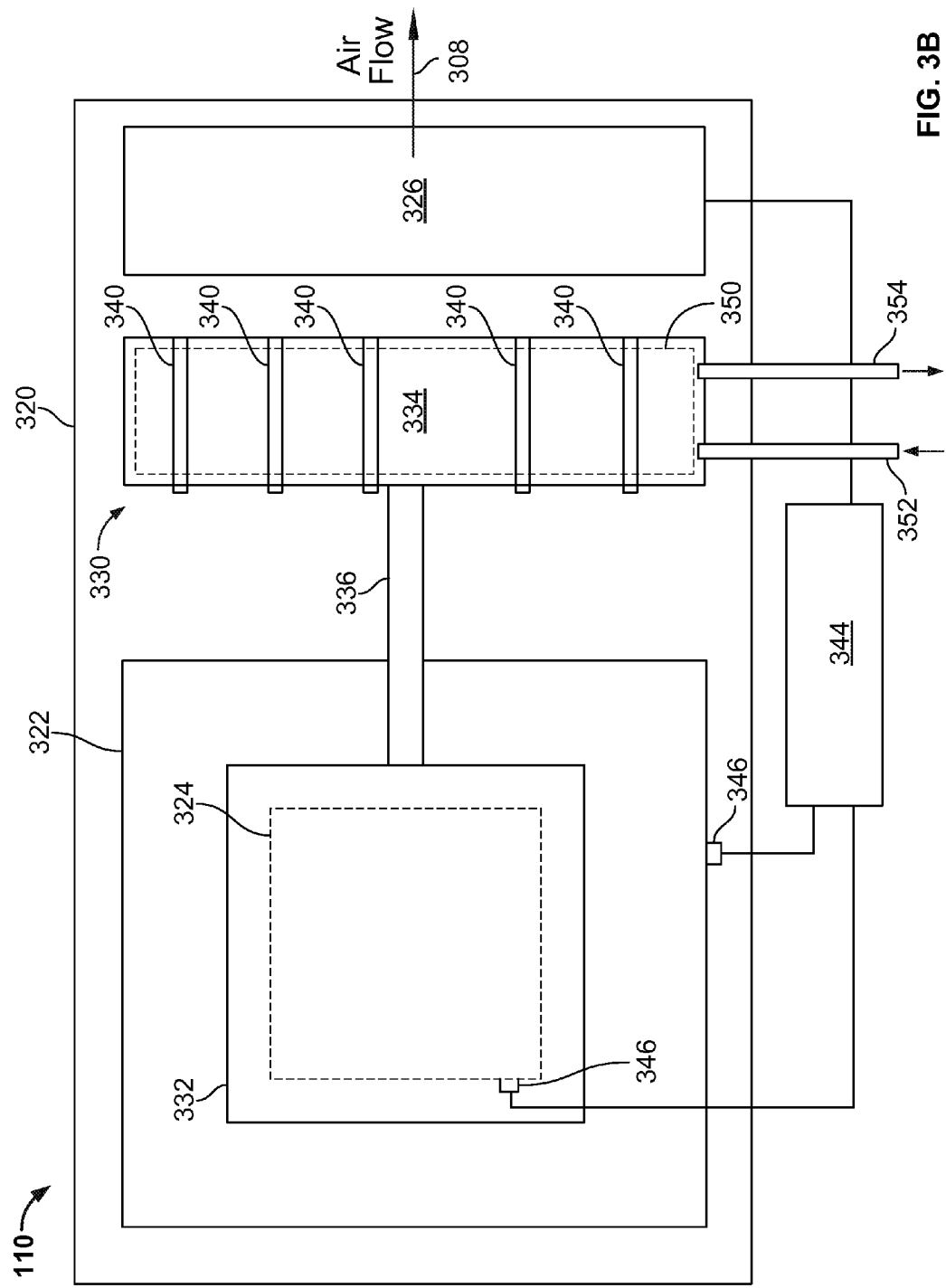

Referring to FIGS. 3A-3B, another example implementation of the server rack sub-assembly 110 includes a frame or cage 320, a printed circuit board 322, e.g., motherboard, supported on the frame 320, one or more heat-generating electronic devices 324, e.g., a processor or memory, mounted on the printed circuit board 322, and a cooling module 330. One or more fans 326 can also be mounted on the frame 320.

The frame 320 can include or simply be a flat structure onto which the motherboard 322 can be placed and mounted, so that the frame 320 can be grasped by technicians for moving the motherboard into place and holding it in position within the rack 105. For example, the server rack sub-assembly 110 may be mounted horizontally in the server rack 105 such as by sliding the frame 320 into the slot 107 and over a pair of rails in the rack 105 on opposed sides of the server rack sub-assembly 110—much like sliding a lunch tray into a cafeteria rack. Although FIGS. 3A-3B illustrate the frame 320 extending below the motherboard 322, the frame can have other forms (e.g., by implementing it as a peripheral frame around the motherboard) or may be eliminated so that the motherboard itself is located in, e.g., slidably engages, the rack 105. In addition, although FIG. 3A illustrates the frame 320 as a flat plate, the frame 320 can include one or more side walls that project upwardly from the edges of the flat plate, and the flat plate could be the floor of a closed-top or open-top box or cage.

The illustrated server rack sub-assembly 110 includes a printed circuit board 322, e.g., a motherboard, on which a variety of components are mounted, including heat-generating electronic devices 324. Although one motherboard 322 is illustrated as mounted on the frame 320, multiple motherboards may be mounted on the frame 320, depending on the needs of the particular application. In some implementations, the one or more fans 326 can be placed on the frame 320 so that air enters at the front edge (at the left hand side in FIGS. 3A-3B) of the server rack sub-assembly 110, closer to the front of the rack 105 when the sub-assembly 110 is installed in the rack 105, flows (as illustrated) over the motherboard 322, over some of the heat generating components on the motherboard 322, and is exhausted from the server rack assembly 110 at the back edge (at the right hand side), closer to the back of the rack 105 when the sub-assembly 110 is installed in the rack 105. The one or more fans 326 can be secured to the frame 320 by brackets. Thus, the fans 326 can pull air from within the frame 320 area and push the air after it has been warmed out the rack 105. An underside of the motherboard 322 can be separated from the frame 320 by a gap.

The server rack sub-assembly 110 includes a cooling module 330 that operates to move heat from the electronic devices 324, to a hot side 332 of the cooling module, and to a cold side 334 of the cooling module 330 to be transferred away from the sub-assembly 110 with one or more cooling fluids. In the example implementation shown in FIGS. 3A-3B, the cooling module 330 is a heat pipe 330 that includes an evaporator portion 332 as the hot side, condensate/vapor lines 336, and a condenser portion 334 as the cold side. A working fluid 348 is circulated between the evaporator portion 332 and the condenser portion 334. In alternative aspects, however, the cooling module 330 may be a thermosiphon, a heat pump, or other device that is operable to transfer heat from a hot side 332 located on, in thermal conductive conduct with, or near the electronic devices 324 to a cold side 334 to be removed by the one or more cooling fluids. In some aspects, a thermal interface 360, such as a phase change heat transfer material, may be positioned between the electronic devices 324 and the evaporator portion 332, e.g., to increase conductive heat transfer therebetween.

As a heat pipe, the cooling module 330 operates as follows. The evaporator portion 332 contacts the electronic device 324 so that heat is drawn by conductive heat transfer from the electronic device 324 to the evaporator portion 332. For example, the evaporator portion 332 is in conductive thermal contact with the electronic device 324. In particular, the bottom of the evaporator portion 332 contacts the top of the electronic device 324. In operation, heat from the electronic device 324 causes a working fluid 348 in the evaporator portion 332 to evaporate. The vapor then passes through condensate/vapor lines 336 to the condenser portion 334. During operation, a liquid phase of a working fluid 348 can fill a bottom portion of an interior volume of the condensate/vapor line 336, with the bottom portion extending from the condenser portion 334 to the evaporator portion 332, and a vapor phase of the working fluid 348 can pass through a top portion of the interior volume of the condensate/vapor line 336, with the top portion extending from the condenser portion 334 to the evaporator portion 332. The working fluid 348 in the condenser portion 334 may transfer heat to a cooling fluid, as described more fully below, and change phase from vapor to liquid. In liquid phase, the working fluid 348 may return to the evaporator portion 332.

As illustrated, a cold side 350 is mounted on the server tray sub-assembly 110 in conductive thermal contact with the cold side 334. In some aspects, there may be a single cold side portion of the cooling module 330 that includes both the cold side 334 and the cold side 350. The cold side 350, as illustrated, receives a cooling liquid supply 352 and outputs a cooling liquid return 354. The cold side 350, therefore, is or includes a heat exchanger (e.g., shell and tube, plate and frame, fin and tube, or otherwise) that receives a cooling liquid (e.g., chilled water, condenser water, chilled glycol, ammonia, refrigerant, or otherwise) and transfers heat from the cold side 334 (e.g., received from the electronic devices 324 through the working fluid 348) to the cooling liquid.

In some aspects, the cooling liquid supply 352 is coupled to a cooling plant (not shown) that generates, e.g., through chilled water mechanical refrigeration, evaporative cooling, DX refrigeration, or otherwise, the cooling liquid and circulates (e.g., pumps) the cooling liquid in the cooling liquid supply 352. In particular, in some aspects, the cooling liquid supply 352 and cooling liquid return 354 are the same phase (e.g., liquid) in that no phase change occurs in the cold side 350.

Further, in some aspects, a flow rate of the cooling liquid supply 352 (and return 354) is substantially constant (e.g., unmodulated). For instance, the cooling liquid supply 352 may be circulated (e.g., pumped) to the cold side 350 at a constant, non-zero flow rate that can be determined or calculated according to an expected heat load (e.g., an average or median heat load) of the electronic devices 324. In another example, the constant, non-zero flow rate that can be determined or calculated according to a maximum heat load of the electronic devices 324. As another example, the constant, non-zero flow rate that can be determined or calculated according to historical data of a heat load of the electronic devices 324 (e.g., by time of day, time of month, time of year, workload of the electronic devices 324, expected or actual utilization of the electronic devices 324, or otherwise).

In other example implementations, the cooling liquid supply 352 may be circulated (e.g., pumped) to the cold side 350 at a variable, non-zero flow rate that can be determined or calculated according to an expected heat load (e.g., an average or median heat load) of the electronic devices 324, a maximum heat load (e.g., based on a nameplate power capacity) of the electronic devices 324, or otherwise. In such examples, there may be one or more control valves (not shown) coupled to the cooling liquid supply 352 or a cooling liquid return 354 in order to modulate the flow rate (e.g., by the controller 344).

The cooling liquid supply 352 may have a cooling capacity sized or designed (e.g., flow rate and/or temperature) to remove all or part of a heat load of the electronic devices 324. For instance, in some aspects, the cooling liquid supply 352 may be a primary cooling source for the server tray sub-assembly 110. In some examples, all of the heat generated by the electronic devices 324 may be transferred to the cold side 334 through the cooling module 330, and then, by conductive heat transfer, to the cold side 350. The heat transferred to the cold side 350 may then be transferred to the cooling liquid supply 352. In some examples, the cooling capacity (e.g., flow rate and/or temperature) of the cooling liquid supply 352 may be sized to remove less than a maximum possible heat load of the electronic devices 324 (e.g., based on nameplate power ratings), but enough to remove a heat load of the electronic devices 324 during normal operating conditions (e.g., less than a maximum possible heat load of the electronic devices 324).

In some instances, normal operating conditions of the electronic devices 324 may produce an average heat load that is less than the maximum heat load. For example, a fixed amount of cooling liquid supply 352 may be circulated to the cold side 350, and that fixed amount may be less than an amount needed to remove all of the heat load of the electronic devices 324 operating at a maximum, or nameplate, power. Thus, in some cases, the ability to allocate less than the absolute maximum amount of cooling liquid supply 352 to a server tray sub-assembly 110 (and many thousands of such sub-assemblies 110 in a data center) may provide that more sub-assemblies 110 (and devices 324) can be cooled with the same amount cooling liquid from a facility cooling plant. Or, the facility cooling plant can be downsized while still cooling the same amount of sub-assemblies 110 (and devices 324).

As shown in FIGS. 3A-3B, another cooling fluid, in the form of an airflow 308, may be circulated over the cold side 334 by the fans 326 to convectively remove heat from the electronic devices 324. In some examples, the airflow 308 may be a secondary cooling source in combination with the cooling liquid supply 352 as the primary cooling source. Further, the cold side 334 may include a heat transfer surface 340 (e.g., fins or otherwise) to enhance a rate of heat transfer from the cold side 334 to the airflow 308. Heat, from the electronic devices 324, that is transferred to the airflow 308, may be removed from the server tray sub-assembly 110, e.g., by circulating the airflow 308 to an ambient environment, to a heat exchanger (e.g., cooling coil) that transfers the heat to a cooling liquid, or otherwise.

As shown in FIGS. 3A-3B, a controller 344 (or control system) is communicably coupled to one or more sensors 346 and the fan 326. Generally, the controller 344 may receive one or more inputs from the sensors 346 (as well as other inputs) and control the fan 326 (e.g., a speed or operational state). In some aspects, inputs into the controller 344, such as the sensors 346 may be indicative of the heat load of the electronic devices 324. For example, the sensors 346 may measure a temperature of the electronic devices 324 and/or the motherboard 322. Also, sensors may measure a temperature, pressure, and/or liquid level of the working fluid 348 in the evaporator portion 332. Although not specifically shown, temperature, pressure, and/or level of the working fluid 348 may be measured in the condenser portion 334 or conduit 336 as indicative of the heat load of the electronic devices 324.

One or more operational parameters of the electronic devices 324 may also be measured by sensors (not shown) that may be indicative of the heat load of the electronic devices 324. For example, power usage (e.g., current, voltage, or power) of the electronic devices 324 may be measured and may be indicative of the heat load of the electronic devices 324. As another example, operational speed or frequency (e.g., Hz) of the electronic devices 324 may be measured and may be indicative of the heat load of the electronic devices 324. As another example, utilization (e.g., number of jobs executed or to be executed, or otherwise) of the electronic devices 324 may be measured and may be indicative of the heat load of the electronic devices 324. Such parameters may also be provided to the controller 344.

Sensed, calculated, measured, or otherwise determined parameters associated with the heat load of the electronic devices 324 may be provided to (or determined by) the controller 344 and used to control, for example, the fan 326. For example, a dynamic, or real-time, heat load of the electronic devices 324 may be determined or calculated according to such parameters. The controller 344 may determine that, in some cases, the dynamic, or real-time, heat load of the electronic devices 324 may be removed and transferred to a primary cooling source, e.g., the cooling liquid supply 352, without a secondary cooling source, e.g., the cooling airflow 308 circulated by the fan 326. In such cases, the controller 344 may control the fan 326 to an "off," or minimal airflow, position.

The controller 344 may determine that, in some cases, the dynamic, or real-time, heat load of the electronic devices 324 may be above or exceed a cooling capacity of a primary cooling source, e.g., the cooling liquid supply 352. In such cases, the controller 344 may control a secondary cooling source, e.g., the airflow 308 circulated over the cold side 334, to account for a difference between the dynamic heat load of the electronic devices 324 and the cooling capacity of the cooling liquid supply 352. For example, the fan 326 may be controlled to an "on" position, or may be increased in speed, based on the excess heat load over the cooling capacity of the cooling liquid supply 352. In some instances, the speed of the fan 326 may be controlled by the controller 344 proportionally (e.g., directly or indirectly) based on the excess heat load over the cooling capacity of the cooling liquid supply 352. Thus, the cooling airflow 308 circulated by the fan 326 over the cold side 334 may be used to provide an additional cooling capacity with the cooling capacity of the cooling liquid supply 352 to cool the electronic devices 324.

In some aspects, the secondary cooling source, e.g., the cooling airflow 308 circulated by the fan 326, may be a redundant cooling source to the primary cooling source, e.g., the cooling liquid supply 352. For example, both of the cooling liquid supply 352 and the cooling airflow 308 circulated by the fan 326 may be sized to provide a cooling capacity about equal to an expected heat load of the electronic devices 324, whether the expected heat load is a heat load due to average use (e.g., power) of the electronic devices 324, a heat load due to maximum use (e.g., power) of the electronic devices 324, or otherwise. Thus, the controller 344 may determine and/or select the particular cooling source to use. For example, the controller 344 may modulate a valve (not shown) fluidly coupled to the cooling liquid supply 352 to a closed position and control the fan 326 to provide a cooling capacity for the heat load of the electronic devices 324. As another example, the controller 344 may turn off or slow down the fan 326 and open or modulate the valve fluidly coupled to the cooling liquid supply 352 to provide a cooling capacity for the heat load of the electronic devices 324.

Figure 4:
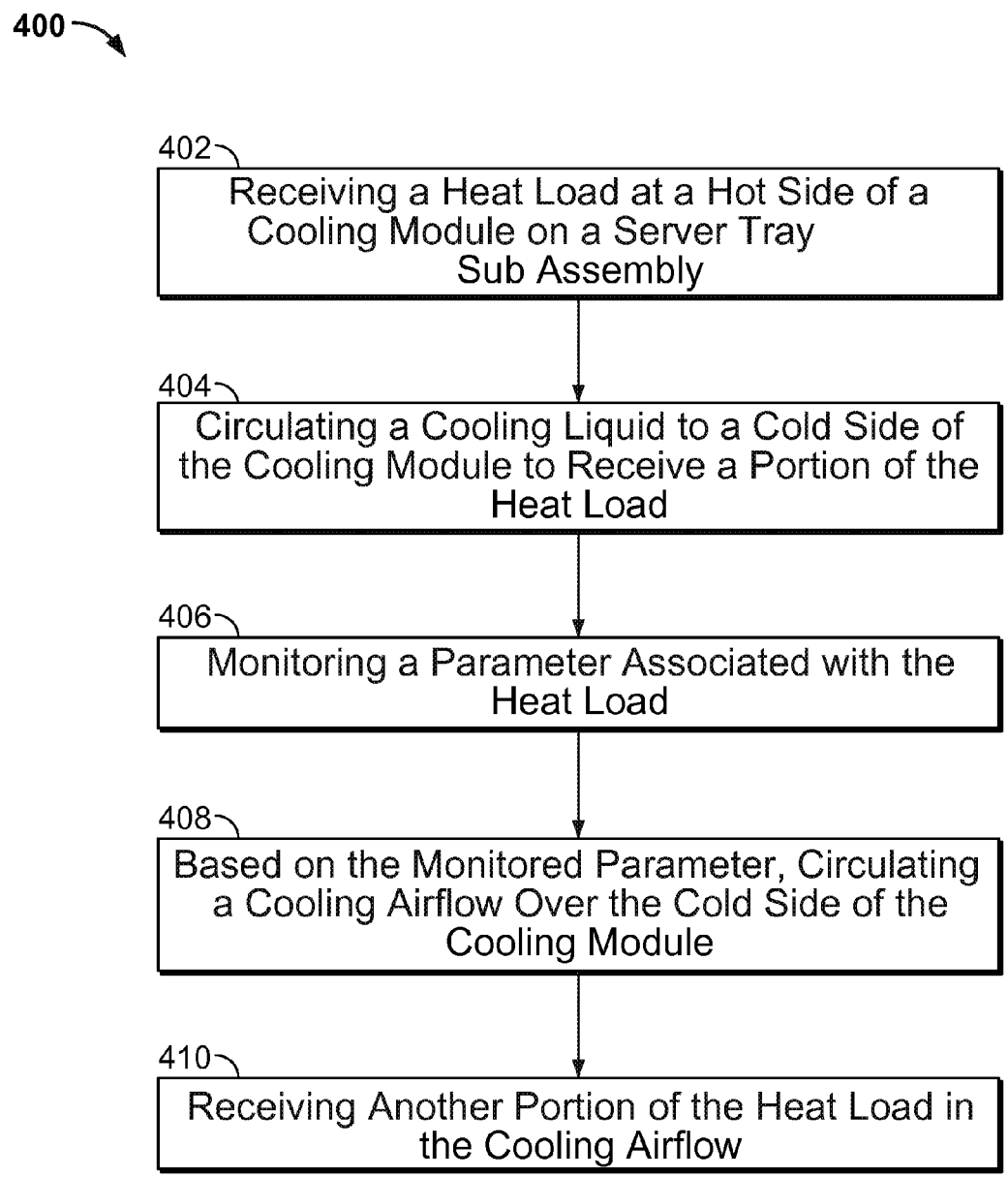
FIG. 4 is a flowchart that illustrates an example method of cooling heat generating devices in a data center.

FIG. 4 is a flowchart that illustrates an example method 400 of cooling heat generating devices in a data center. In some aspects, the method 400 may be performed by or with the server tray sub-assembly 110 as described above, or with similar components in accordance with the present disclosure.

Step 402 includes receiving a heat load at a hot side of a cooling module on a server tray sub-assembly. In some aspects, the heat load is generated by one or more electronic devices (e.g., processors, memory, network devices, or otherwise) mounted on the server tray sub-assembly, or on a motherboard that is part of the server tray sub-assembly. In some aspects, the cooling module is a thermosiphon, or a heat pipe, or a heat pump, or other module that can transfer heat from one location to another location (e.g., with a working fluid). In some aspects, the hot side of the cooling module may be an evaporator or evaporator portion that receives heat through thermal conductive contact with the electronic devices to vaporize a working fluid within the hot side. In some aspects, a thermal interface, such as a phase change material, is positioned between the electronic devices and the hot side, and in contact with both the devices and the hot side to enhance conductive heat transfer. As part of step 404, heat transferred to the working fluid in the hot side is then transferred, e.g., with the vaporized working fluid, to a cold side of the cooling module. The cold side of the cooling module may be, for instance, a condenser or condenser portion, which receives the working fluid in vapor form.

Step 404 includes circulating a cooling liquid to the cold side of the cooling module to receive a portion of the heat load. For example, the cold side of the cooling module, or a portion of the cold side of a cooling module, may include or be a heat exchanger (e.g., cooling coil, plate and frame, fin and tube, or otherwise) that receives the cooling liquid (e.g., chilled water/glycol, evaporatively-cooled liquid, refrigerant, or otherwise) and transfers at least a portion of the heat load to the cooling liquid. In some aspects, the portion of the heat load may be all or substantially all of the heat load generated by the electronic devices. In some aspects, the portion of the heat load may be less than all of the total heat load generated by the electronic devices. As described above, in some aspects, the cooling liquid is circulated (e.g., pumped) to the cold side of the cooling module at a fixed flow rate (e.g., unmodulated). In other aspects, the cooling liquid may be circulated to the cold side with a variable flow rate that depends, for example, on a magnitude of the portion of the heat load.

Step 406 includes monitoring a parameter associated with the heat load of the electronic devices. In some aspects, the parameter may be a temperature, such as a temperature of the electronic devices, a temperature of the hot side of the cooling module, a temperature of an air or airflow adjacent or near the electronic devices, a temperature of the cooling liquid (e.g., on a return side of the cooling liquid), or other temperature. In alternative aspects, the parameter may be a power parameter of the electronic devices, such as real-time current or voltage or clock frequency. In alternative aspects, the parameter may be a utilization parameter of the electronic devices, such as a number of threads, or jobs, being processed or predicted to be processed in a near future. In some aspects the monitored (or sensed or calculated) parameter may be directly representative of a real-time heat load of the electronic devices. In alternative aspects, the monitored (or sensed or calculated) parameter may be an estimate or representation of a real-time heat load of the electronic devices.

Step 408 includes circulating a cooling airflow over the cold side of the cooling module based, at least in part, on the monitored parameter. For example, in some aspects, the monitored parameter may indicate that the heat load (e.g., dynamic or real-time) is greater than a maximum cooling capacity of the cooling liquid circulated to the cooling module in step 404. For instance, in some aspects, the cooling liquid is circulated at a fixed flow rate, with a relatively fixed cooling capacity based at least in part on the fixed flow rate, to the cold side of the cooling module. The relatively fixed cooling capacity may be less than a maximum heat load of the electronic devices. For instance, the fixed cooling capacity may be approximately equal to an average heat load of the electronic devices based on, for example, historical heat load data of the electronic devices. Thus, the cooling airflow may be circulated when the monitored parameter indicates a dynamic or real-time heat load that is in excess of the average heat load of the electronic devices.

Step 410 includes receiving another portion of the heat load in the cooling airflow. For example, the additional portion may be the dynamic or real-time heat load that is in excess of the average heat load of the electronic devices as described in step 408. Thus, a total heat load of the electronic devices may be transferred in part to the cooling liquid and in part to the cooling airflow. In some aspects, the cooling liquid may be a primary cooling source into which a base heat load of the electronic devices is transferred, while the cooling airflow may be a secondary cooling source into which an excess, or trim, heat load of the electronic devices is transferred (e.g., when necessary).

Additional methods, processes, algorithms, and/or control operations (e.g., by a controller) may be implemented by one or more server rack sub-assemblies with cooling modules according to the present disclosure. For example, some control operations may address and/or optimize a cooling performance of a cooling module, such as a thermosiphon, that is used to cool heat generating electronic devices on a server tray sub-assembly. As described above, thermosiphon operation is generally based on a working fluid (e.g., refrigerant) loop between a heat source (e.g., hot side, or evaporator) and a heat sink (e.g., cold side, or condenser). The working fluid absorbs heat from the evaporator in the form of latent heat and transfers it to the condenser, where the working fluid condenses and dissipates the heat to a cooling source or sources (e.g., a cooling liquid and/or a cooling airflow). Hydrostatic liquid head may provide the force for the circulation of the working fluid.

In some aspects, performance of the condenser is measured by a temperature rise between evaporator and condenser (e.g., sensed by sensors such as sensors 246) divided by the transferred heat (e.g. $°C./W$). The performance may be a function of the temperature rise in the evaporator and the condenser. In the evaporator, a convection coefficient of liquid working fluid over a heated surface may affect thermosiphon performance. In some aspects, if the liquid working fluid returning from the condenser is sub-cooled (e.g., highly or otherwise), a portion of the heat transfer area will experience a single phase heating process to raise the temperature of the working fluid (e.g., temperature rise in working fluid without phase change). The single phase process provides a much lower heat transfer coefficient compared to a two phase process, where heat is transferred to saturated working fluid liquid to generate a working fluid vapor. In some aspects, performance of the thermosiphon may increase by maintaining and/or controlling a relatively low level of sub-cooled liquid working fluid.

Temperature based control systems or controller may be used, as described above, to control the cooling capacity of the thermosiphon (e.g., by controlling a pumping of a cooling liquid or fan speed to generate a cooling airflow). In some examples, if the power in the heat source (e.g., electronic devices) rises, temperature of the heat source will increase, which may result in the controller increasing the speed of the fans to further cool the condenser. Increasing the fan speed (and thus volumetric rate of the cooling airflow) may increase the sub-cooling level at the condenser's working fluid outlet, which may result in lower convection coefficient in the evaporator and further increase in the heat source temperature. This could result in an unstable or "hunting" control loop by the controller.

In some aspects, a controller (or other control system) may operate to maintain and/or control a relatively low level of sub-cooled liquid working fluid in a thermosiphon as part of a server tray sub-assembly, while avoiding unstable operation. For instance, in one example operation, a temperature sensor may be placed at a working fluid outlet of the evaporator and another temperature sensor may be placed at a working fluid outlet of the condenser. The difference between the two sensors may provide for and/or estimate a sub-cooling level of the working fluid in the condenser. By determining the sub-cooling level, this parameter may be used by the controller to adjust one or more components of the thermosiphon, such as for example, flow rate of a cooling liquid and/or fan speed for a cooling airflow. For instance, if the sub-cooling level exceeds a particular threshold, pump and/or fan speed (or valve position for a cooling liquid) may be adjusted. For example, fan speed may be decreased, pump speed may be decreased, and/or a cooling liquid control valve may be adjusted toward a closed position. If the sub-cooling level is below a particular threshold, pump and/or fan speed (or valve position for a cooling liquid) may be adjusted as well. For example, fan speed may be increased, pump speed may be increased, and/or a cooling liquid control valve may be adjusted toward an open position.

In another example control operation, other variables may be used to determine or calculate a sub-cooling level and the performance of the thermosiphon. For example, parameter such as total heat transferred to the thermosiphon, heat source temperature (e.g., temperature of one or more electronic devices), cooling airflow temperature (e.g., temperature at a front of the server tray sub-assembly, a back of the server tray sub-assembly, or difference therebetween), cooling liquid temperature (e.g., temperature of a cooling liquid supply, temperature of a cooling liquid return, or difference therebetween), and/or fan/pump speed may be measured. Then, a performance of the thermosiphon may be calculated by the following example equation:

$$R = (\text{Temp\_hot} - \text{Temp\_cool}) / P\_\text{total}, \text{ where}$$

R represents thermosiphon cooling performance, Temp_hot−Temp_cool represents a difference in temperature of a cooling airflow or cooling liquid, and P_total represents a total amount of heat transferred to the thermosiphon.

In an example cooling system, a desired performance range of the thermosiphon system against, e.g., fan speed (RPM) may be known (e.g., from empirical data). If the performance of the thermosiphon drops below the desired performance range, this can be related to extra sub-cooled liquid at the condenser outlet, which has dropped the performance of the evaporator. Therefore, reducing the speed of the fan will reduce the heat extracted from the condenser and reduce the sub-cooled level, therefore increasing the thermosiphon performance. By adjusting the sub-cooling level, consumed fan power may be reduced while performance of the cooling system may be increased.

Figure 5:
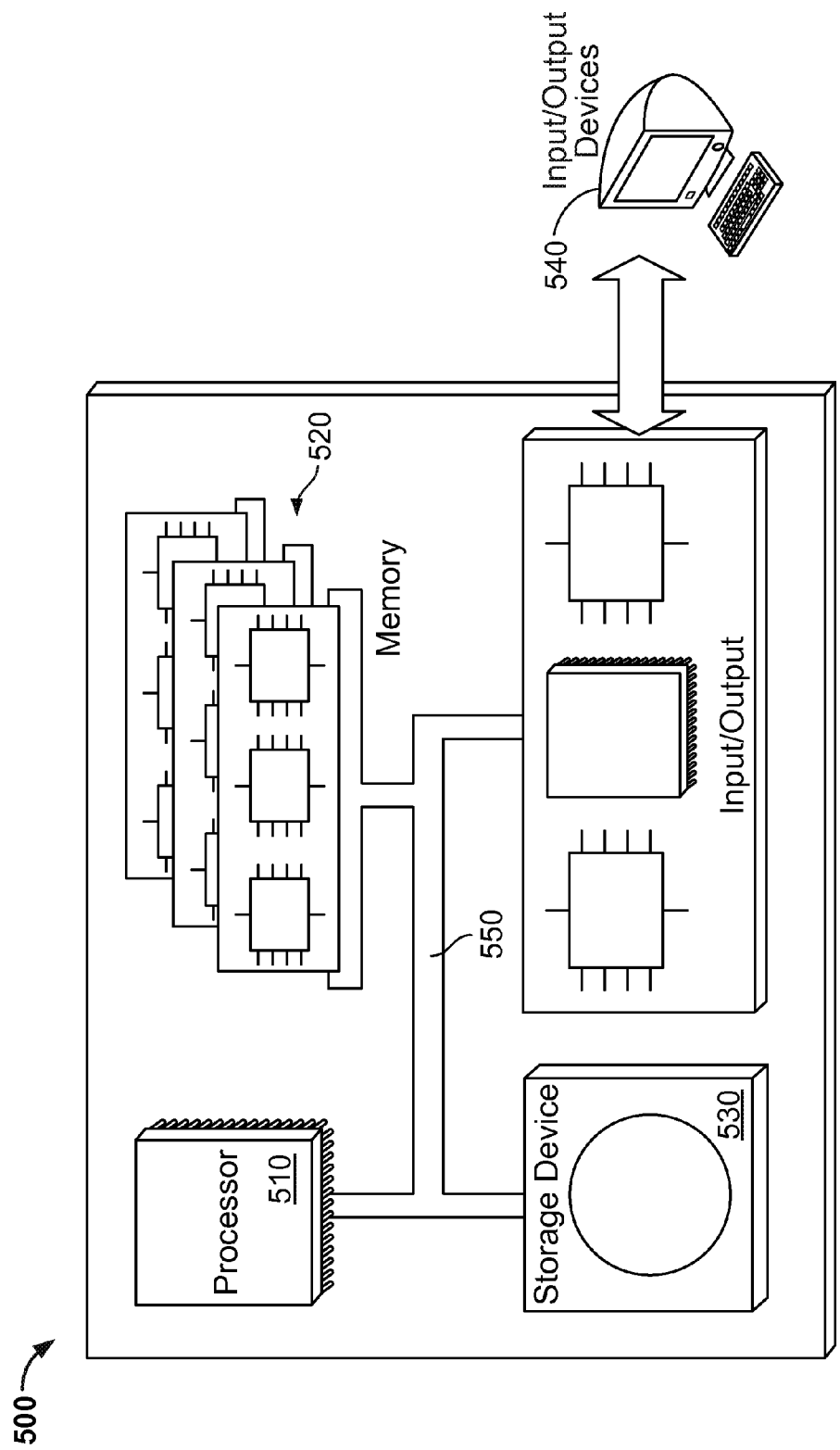
FIG. 5 is a schematic diagram of a computer system that can be used for the operations described in association with any of the computer-implemented methods described herein.

FIG. 5 is a schematic diagram of a control system (or controller) 500. The system 500 can be used for the operations described in association with any of the computer-implemented methods described previously, for example as or as part of the controllers (e.g., controller 244 or 344) or other controllers described herein. For example, the system 500 may be used in providing local control for particular ones of or small groups of, combined power/cooling units described above, or in providing master control over an entire data center or multiple data centers of such units. Moreover, the system 500 may describe computing resources that may operate as the loads to be cooled by the systems and methods described above.

The system 500 is intended to include various forms of digital computers, such as laptops, desktops, workstations, personal digital assistants, servers, blade servers, mainframes, and other appropriate computers. The system 500 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of embodiments have been described. Nevertheless, it will be understood that various modifications may be made without departing from the spirit and scope of what is described. For example, the steps of the exemplary flow chart in FIG. 4 may be performed in other orders, some steps may be removed, and other steps may be added. As another example, although a fan that generates a cooling airflow as a secondary or redundant cooling source for electronic devices mounted on a server tray sub-assembly is illustrated as being mounted on the tray sub-assembly, the fan or additional fans may be positioned in other locations and not mounted on the sub-assembly but in airflow communication with the sub-assembly during operation. Accordingly, other embodiments are within the scope of the following claims.

What is claimed is:

1. A data center cooling system, comprising:
   a server tray sub-assembly;
   a plurality of heat generating electronic devices mounted on the server tray sub-assembly; and
   a cooling module coupled to the server tray sub-assembly and comprising:
      a hot side in conductive thermal contact with the plurality of heat generating electronic devices;
      a cold side comprising a heat exchanger having a cooling liquid inlet to receive a flow of a cooling liquid and a cooling liquid outlet, the heat exchanger having a cooling capacity of a first portion of a heat load of the plurality of heat generating electronic devices that is less than a maximum heat load of the plurality of heat generating electronic devices; and
      a heat transfer surface thermally coupled to the cold side and arranged to receive a cooling airflow from a fan positioned to circulate the cooling airflow across the heat transfer surface, the heat transfer surface having a cooling capacity of a second portion of the heat load of the plurality of heat generating electronic devices; and
   a control system that comprises a sensor and a controller, the sensor arranged to measure a parameter associated with the heat load of the plurality of heat generating electronic devices, the controller communicably coupled to the fan to adjust the fan based, at least in part, on the measured parameter indicating that the heat load of the plurality of heat generating electronic devices is greater than the cooling capacity of the heat exchanger.

2. The data center cooling system of claim 1, wherein a sum of the heat exchanger cooling capacity and the heat transfer surface cooling capacity is equal to the maximum heat load of the plurality of heat generating electronic devices.

3. The data center cooling system of claim 1, wherein the cold side comprises:
   a first cold plate in conductive thermal contact with the heat transfer surface; and
   a second cold plate that comprises the heat exchanger and is in conductive thermal contact with the first cold plate.

4. The data center cooling system of claim 1, wherein the heat transfer surface comprises a base and a plurality of fins extending from the base.

5. The data center cooling system of claim 1, wherein the fan is positioned on the server tray assembly.

6. The data center cooling system of claim 1, wherein the sensor comprises a hot side temperature sensor and a cold side temperature sensor, and the controller is communicably coupled to the hot side temperature sensor and the cold side temperature sensor to determine a sub-cooling level of a working fluid circulating between the hot side and the cold side, and to adjust at least one of a flow rate of the cooling liquid or a flow rate of the cooling airflow in response to the determined sub-cooling level of the working fluid.

7. The data center cooling system of claim 1, wherein the measured parameter comprises a temperature of at least one of the plurality of heat generating electronic devices.

8. A method for cooling heat generating devices in a data center, comprising:
   receiving a heat load, generated by a plurality of heat generating electronic devices supported on a rack-mounted tray, at a hot side of a cooling module coupled to the rack-mounted tray, the hot side in conductive thermal contact with at least a portion of the plurality of heat generating electronic devices;
   circulating a flow of a cooling liquid to a heat exchanger arranged in a cold side of the cooling module, the flow of the cooling liquid receiving, in the heat exchanger, at least a first portion of the heat load that is less than a maximum heat load of the plurality of heat generating electronic devices;
   monitoring a parameter associated with the heat load;
   based on the monitored parameter indicating that the heat load generated by the plurality of heat generating electronic devices is greater than a cooling capacity of the heat exchanger, circulating a cooling airflow over a surface of the cold side of the cooling module; and
   receiving, in the cooling airflow, a second portion of the heat load.

9. The method of claim 8, further comprising transferring the heat load from the hot side to the cold side in a working fluid that circulates between the hot side and the cold side.

10. The method of claim 8, wherein the flow of the cooling liquid is constant.

11. The method of claim 10, wherein a cooling capacity of the constant flow of the cooling liquid is less than the maximum heat load of the plurality of heat generating electronic devices.

12. The method of claim 8, further comprising:
   based on a change in the measured parameter, adjusting a rate of the cooling airflow circulated over the surface of the cold side of the cooling module.

13. The method of claim 12, further comprising maintaining the flow of the cooling liquid at a constant rate while adjusting the rate of the cooling airflow.

14. The method of claim 8, further comprising circulating the cooling airflow over a plurality of fins that extend from the surface of the cold side of the cooling module.

15. The method of claim 9, further comprising:
   determining a sub-cooling amount of the working fluid in the cold side of the cooling module; and
   based on the determined amount of the sub-cooling of the working fluid, adjusting at least one of (i) the flow of the cooling liquid to the heat exchanger arranged in the cold side of the cooling module, or (ii) the cooling airflow circulated over the surface of the cold side of the cooling module.

16. The method of claim 15, wherein the determined sub-cooling amount of the working fluid is based, at least in part, on at least one of:
   a temperature difference of the cooling airflow across the cold side of the cooling module; or
   a temperature difference of the cooling liquid across the heat exchanger.

17. A cooling apparatus for rack-mounted computing devices, comprising:
   a heat sink comprising a thermal interface to conductively contact a computing device mounted on a printed circuit board;
   a cold plate comprising a first portion in thermal communication with the heat sink with a working fluid, and a second portion that comprises a cooling coil in thermal communication with the first portion, the cooling coil comprising an inlet to receive chilled liquid, the cooling coil comprising a maximum cooling capacity less than a maximum heat load of the computing device;
   a fan positioned to circulate airflow over the cold plate; and
   a controller coupled to the fan to adjust a speed of the fan in response to an output of a sensor coupled to the computing device, wherein
   the controller is operable to adjust the speed of the fan based on the output of the sensor indicating that a measured heat load of the computing device is greater than the maximum cooling capacity of the cooling coil.

18. The cooling apparatus of claim 17, wherein the thermal interface comprises a phase change material.

19. The cooling apparatus of claim 17, wherein the sensor comprises a temperature sensor directly coupled to the computing device, and the controller is configured to adjust the speed of the fan while a flow of the chilled liquid to the cooling coil remains substantially constant.

20. The cooling apparatus of claim 19, wherein a sum of the maximum cooling capacity of the cooling coil and a cooling capacity of the airflow is greater than the maximum heat load of the computing device.

21. The cooling apparatus of claim 17, wherein the heat sink and the first portion of the cold plate comprise a heat pipe or a thermosiphon.

* * * * *